United States Patent [19]
Lake

[11] Patent Number: 6,087,731
[45] Date of Patent: Jul. 11, 2000

[54] METHODS OF FORMING FLIP CHIP BUMPS AND RELATED FLIP CHIP BUMP CONSTRUCTIONS

[75] Inventor: Rickie C. Lake, Eagle, Id.

[73] Assignee: Micron Technology, Inc., Boise, Id.

[21] Appl. No.: 09/095,003

[22] Filed: Jun. 9, 1998

[51] Int. Cl.[7] .......................... H01L 23/48; H01L 23/52; H01L 29/40
[52] U.S. Cl. .......................... 257/778; 257/737; 257/738
[58] Field of Search .................... 257/778, 737, 257/738, 780, 781, 784, 779; 228/180.22; 438/613

[56] References Cited

U.S. PATENT DOCUMENTS

| | | | |
|---|---|---|---|
| 2,934,685 | 4/1960 | Jones ....................................... | 257/738 |
| 4,600,600 | 7/1986 | Pammer et al. ........................ | 257/738 |
| 5,022,580 | 6/1991 | Pedder .................................... | 228/56.3 |
| 5,541,135 | 7/1996 | Pfeifer et al. ............................ | 437/60 |
| 5,655,703 | 8/1997 | Jimarez et al. ..................... | 228/180.22 |
| 5,760,469 | 6/1998 | Higashiguchi et al. ................ | 257/678 |
| 5,796,591 | 8/1998 | Dalal et al. ............................. | 257/738 |
| 5,828,128 | 10/1998 | Higashiguchi et al. ................ | 257/738 |

FOREIGN PATENT DOCUMENTS

| | | | |
|---|---|---|---|
| 4-266037 | 9/1992 | Japan ..................................... | 257/737 |

OTHER PUBLICATIONS

IBM Technical Disclosure Bulletin "Encapsulated solder for Chip Mounting" vol. 32 No. 10B Mar. 1990, pp 480.
Ken Gilleo, "Flip or Flop?", Technical Articles of Alpha Metals, Inc., Dec. 1996.
Ken Gilleo et al., "Flip Chip 1, 2, 3: Bump, Bond, Fill", Alpha Metals, Inc., Jul. 1996.

*Primary Examiner*—David Hardy
*Assistant Examiner*—Jhihan B. Clark
*Attorney, Agent, or Firm*—Wells, St. John, Roberts, Gregory & Matkin P.S.

[57] ABSTRACT

Methods of forming flip chip bumps and related flip chip bump constructions are described. In one implementation, a bump of conductive material is formed over a substrate. At least a portion of the bump is dipped into a volume of conductive flowable material, with some of the flowable material remaining over the bump. The remaining flowable material over the bump is solidified and includes an outermost surface the entirety of which is outwardly exposed. In another implementation, the outermost surface include an uppermost generally planar surface away from the substrate. The solidified flowable material together with the conductive material of the bump provide a bump assembly having a height which is greater than the height of the original bump. The increased height is achieved without meaningfully increasing a width dimension of the bump proximate the substrate.

9 Claims, 6 Drawing Sheets

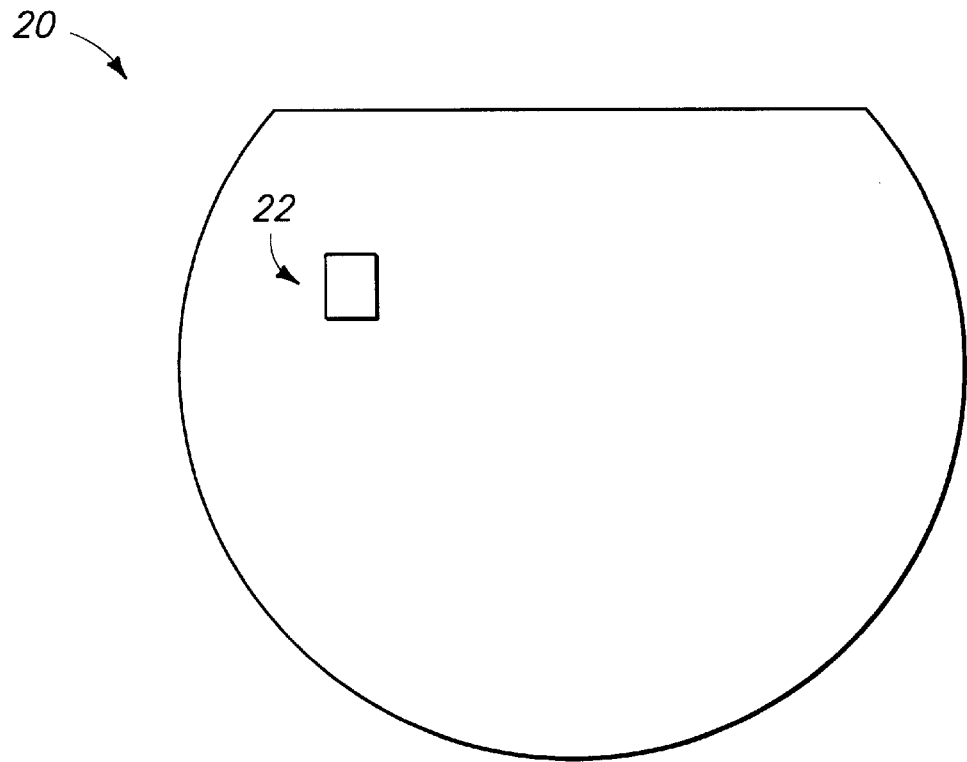
_FIG. 1_
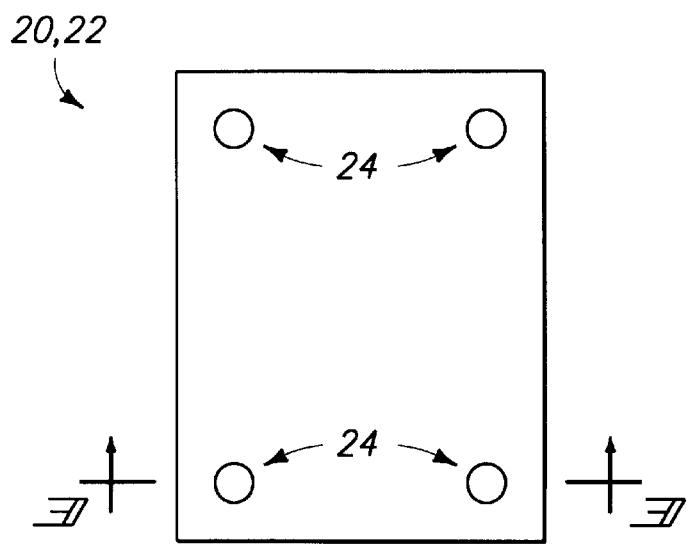
_FIG. 2_

6,087,731

METHODS OF FORMING FLIP CHIP BUMPS AND RELATED FLIP CHIP BUMP CONSTRUCTIONS

RELATED PATENT DATA

This patent resulted from a divisional application of U.S. patent application Ser. No. 08/931,814, filed Sep. 16, 1997, entitled "Methods of Forming Flip Chip Bumps and Related Flip Chip Bump Constructions", naming Rickie C. Lake as inventor.

TECHNICAL FIELD

This application pertains to methods of forming flip chip bumps and to related flip chip bump constructions.

BACKGROUND OF THE INVENTION

One method of integrated circuit interconnection is called flip chip bonding. Here, bumps of solder or other conductive material are deposited onto conductive pads of a semiconductor wafer or chip. After separation of individual dies from the wafer, the individual dies or chips are turned upside down, and the bumps are properly aligned with a metallization pattern on another substrate. The aligned bumps are then joined to appropriate points on the pattern.

This invention arose out of concerns associated with improving flip chip bump constructions and formation techniques. This invention also arose out of concerns associated with improving circuit interconnections which utilize flip chip bumps and the methods through which such interconnections are formed.

SUMMARY OF THE INVENTION

Methods of forming flip chip bumps and related flip chip bump constructions are described. In one implementation, a bump of conductive material is formed over a substrate. At least a portion of the bump is dipped into a volume of conductive flowable material, with some of the flowable material remaining over the bump. The remaining flowable material over the bump is solidified and includes an outermost surface the entirety of which is outwardly exposed. In another implementation, the outermost surface include an uppermost generally planar surface away from the substrate. The solidified flowable material together with the conductive material of the bump provide a bump assembly having a height which is greater than the height of the original bump. The increased height is achieved without meaningfully increasing a width dimension of the bump proximate the substrate.

BRIEF DESCRIPTION OF THE DRAWINGS

Preferred embodiments of the invention are described below with reference to the following accompanying drawings.

FIG. 1 is a top plan view of a semiconductor wafer.

FIG. 2 is a view of an individual die which comprises part of the FIG. 1 wafer.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
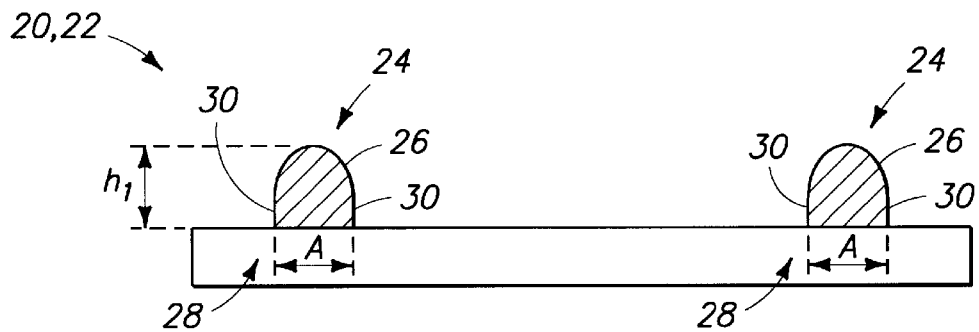
FIG. 3 is a view taken along line 3—3 in FIG. 2.

Referring to FIGS. 1–3, a semiconductor wafer or substrate in process is shown generally at 20. Substrate 20 has been fabricated into discrete die or die areas. An exemplary die or die area is shown at 22. The die areas have integrated circuitry fabricated therewithin and will be singulated into individual die constituting flip chips.

A plurality of bumps 24 of conductive material are formed over substrate 20. For purposes of the ongoing discussion, substrate 20 and/or individual die 22 are considered as a first substrate. The illustrated bumps 24 constitute a portion of a series of bumps which are formed over substrate 20 and make desired contact with bond pads which are not specifically shown. The bond pads enable electrical connections to be made between the resultant chip and circuitry or components external of the chip. Individual bumps of the series have an outer surface 26 which defines a height $h_1$ over the substrate. Individual bump heights can vary between the bumps as will become apparent below. Additionally, bumps can come in a range of heights. An exemplary range can be between about 1.5 to 4.5 mils. Other range values are possible. Bumps 24 also include base portions 28 which are disposed over substrate 22. The base portions define respective first surface areas A which engage substrate 22. First surface areas A define respective width dimensions of each bump which lie in directions in the plane of the page upon which FIG. 3 appears. Typical width dimensions are between about 8–10 mils. Other width dimensions are possible such as width dimensions between about 4–5 mils. The width dimensions are bounded by the outer surface of base portions 28 designated at 30 proximate substrate 22.

Figure 4:
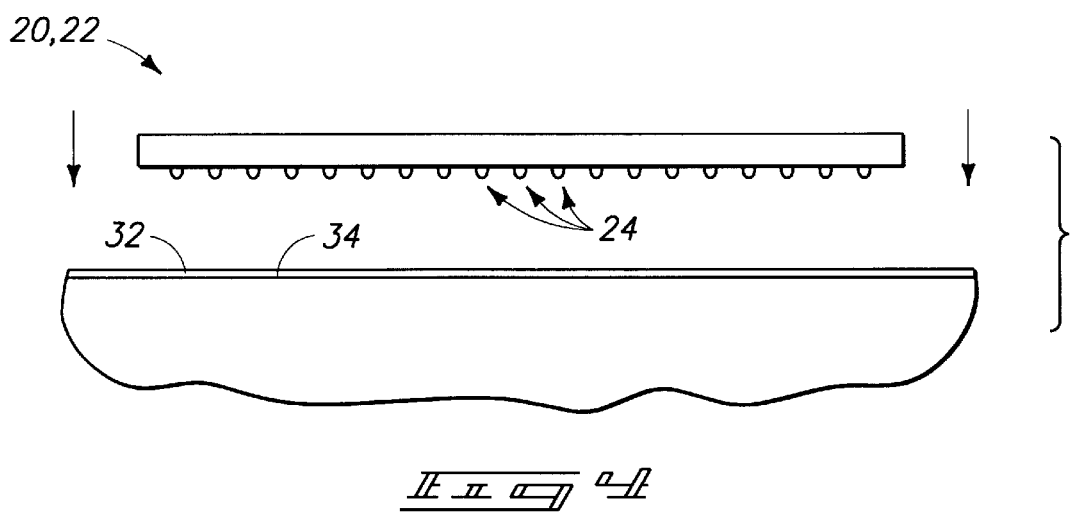
FIG. 4 is a view of the FIG. 1 wafer undergoing processing in accordance with one implementation of the invention.
Figure 5:
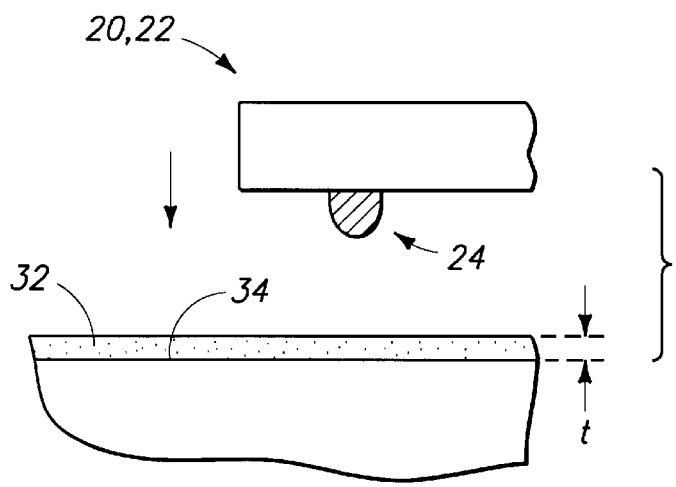
FIG. 5 is a fragmentary portion of the FIG. 4 wafer.

Referring to FIGS. 4 and 5, a volume of conductive flowable material 32 is provided over a surface 34 to a desired thickness t. Substrate 20 is shown in an inverted position with bumps 24 facing flowable material 32. An exemplary thickness t is between about two-thirds to three-fourths of bump heights hi. In the illustrated example, flowable material 32 comprises a conductive epoxy which is drawn down over surface 34; and surface 34 constitutes a generally smooth planar surface such as glass or machined and polished metal.

Figure 6:
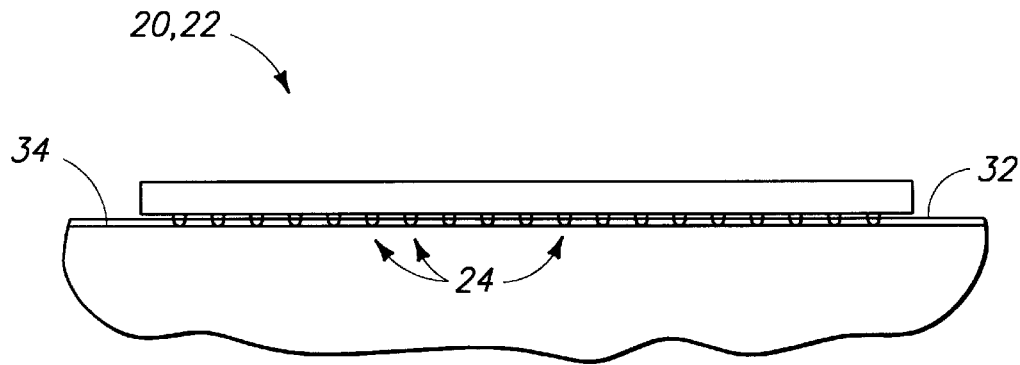
FIG. 6 is a view of the FIG. 1 wafer at a processing step which is different from the one shown in FIG. 4.
Figure 7:
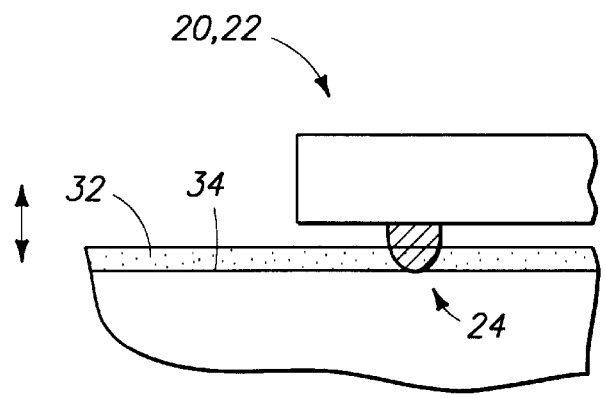
FIG. 7 is a fragmentary portion of the FIG. 6 wafer.

Referring to FIGS. 6 and 7, substrate 20 and surface 34 are moved toward one another sufficiently to immerse at least a portion of bumps 24 in conductive material 32. The bumps are extended into material 32 a distance which is less than the individual bump heights. In some instances, such distance is sufficient to engage a bump with surface 34. In other instances, where the bumps do not have standardized heights, some of the bumps will not be engaged with surface 34.

Figure 8:
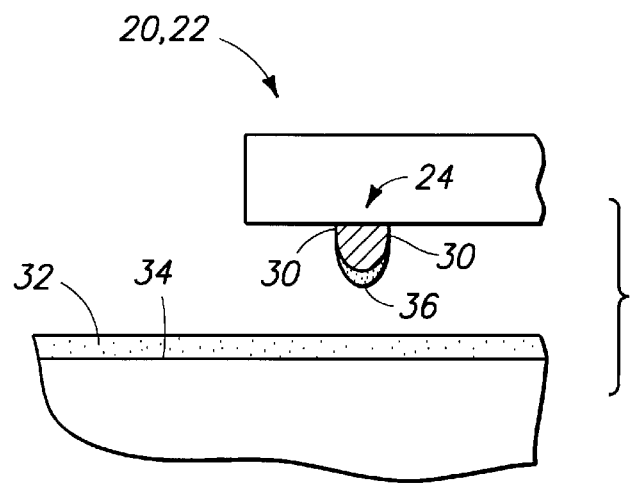
FIG. 8 is a view of the FIG. 7 wafer portion at a different processing step.

Referring to FIG. 8, substrate 20 and material 32 or surface 34 are separated from one another and bumps 24 are removed from material 32. For purposes of the ongoing discussion, the immersing and removing of the bumps into material 34 constitutes dipping the bumps into the flowable material. When the bumps are removed from material 32, at least some flowable material 36 remains over bumps 24 typically in a generally flowable state. In the illustrated example, remaining material 36 is not disposed over base portion outer surface 30. Subsequently, the bumps are exposed to conditions which are effective to at least partially solidify flowable material 36 over the bump. As used in the context of this document, the term "solidify" will be understood to mean imparting a relative firmness to the flowable material. In the illustrated example, material 36 is solidified into a generally non-flowable state. Where material 36 constitutes conductive epoxy, such would be sufficiently cured into the non-flowable state.

Figure 9:
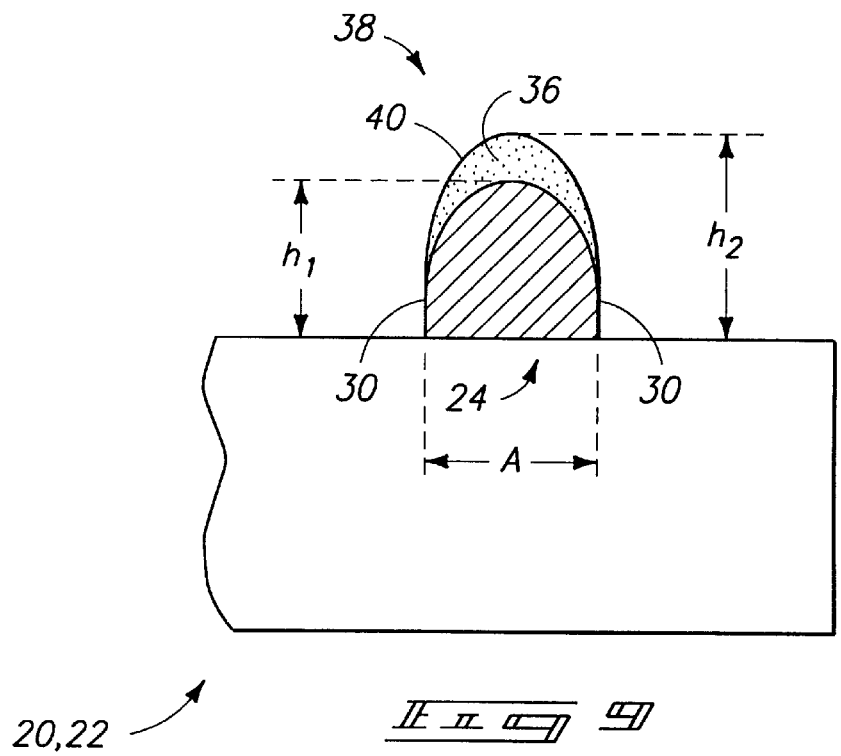
FIG. 9 is an enlarged view of the FIG. 8 wafer portion.
Figure 15:
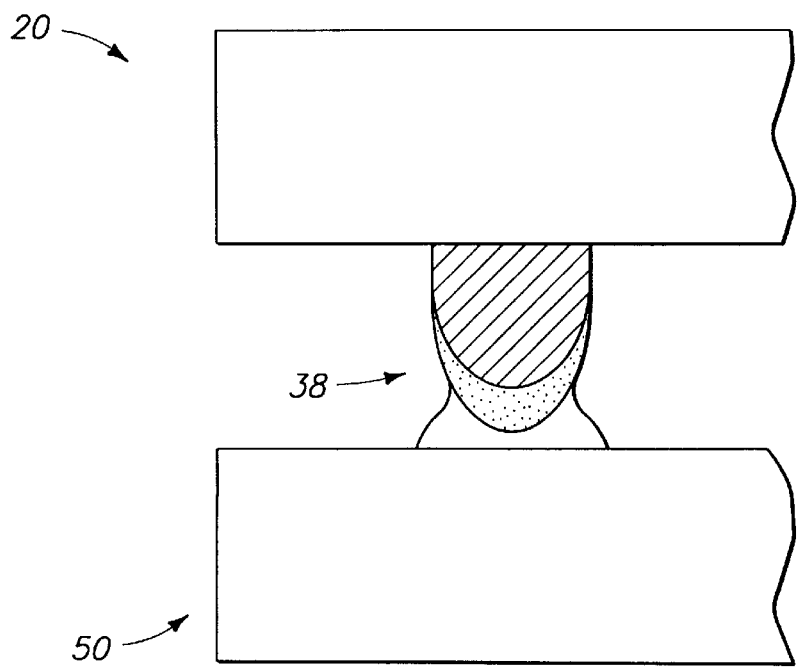
FIG. 15 is a view of a pair of substrates which have been bonded together.

Referring to FIG. 9, solidified material 36 together with original bump 24 provide a bump assembly 38 having a height $h_2$ which is greater than $h_1$. Exemplary heights $h_2$ are greater than or equal to about 5 mils. Bump assembly 38 includes an outermost surface 40 the entirety of which is outwardly exposed. In the illustrated example, bump assembly outermost surface 40 comprises base portion outer surface 30. Accordingly, the addition of solidified material 36 increases the effective bump height without significantly increasing the width dimension. After material 36 is solidified, substrate 20 can be singulated into individual die which can then be bonded with a second substrate 50 (FIG. 15).

Figure 10:
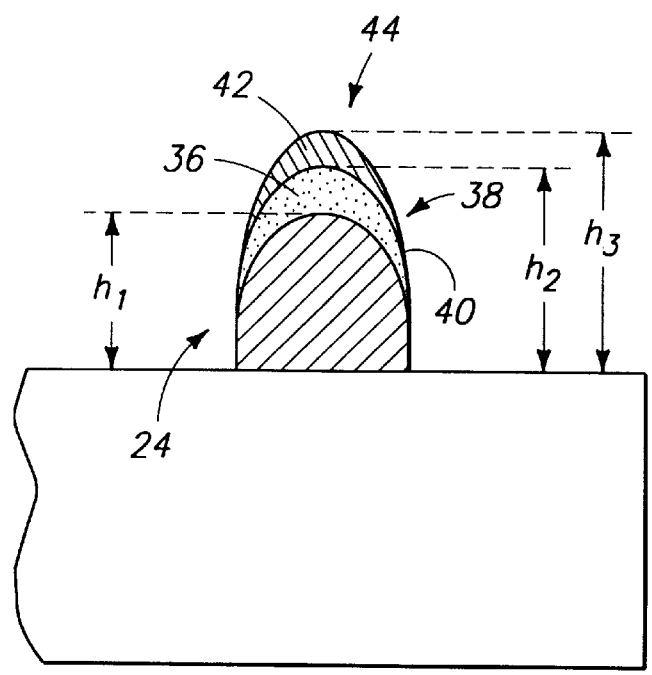
FIG. 10 is a view of the FIG. 9 wafer portion which has been processed in accordance with an alternate embodiment.

Referring to FIG. 10 and in accordance with one aspect of the invention, after material 36 is solidified to provide bump assembly 38, outermost surface 40 can be dipped into a volume of material such as material 32, substantially as described above. Accordingly, at least some flowable material 42 remains over outermost surface 40. Remaining material 42 can be solidified substantially as described above. Alternately, remaining material 42 can be maintained in a generally flowable state and subsequently bonded with a second substrate as in FIG. 15. If material 42 is solidified, such would provide a composite bump assembly 44 having an increased height $h_3$ which is greater than both $h_1$ and $h_2$. Similarly, the addition of solidified material 42 can increase the effective bump height without significantly increasing the width dimension. The process can be repeated as desired.

Figure 11:
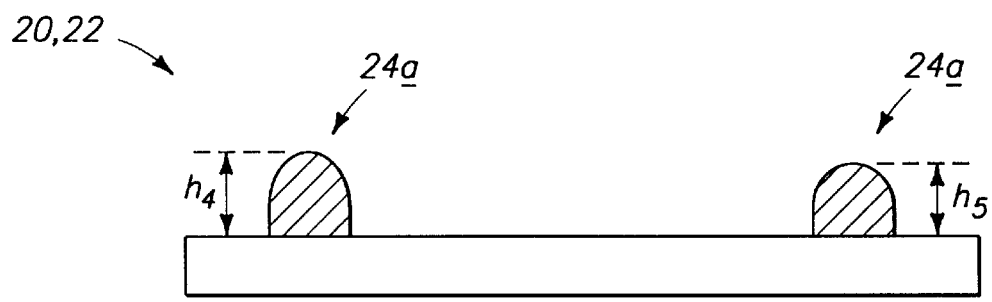
FIG. 11 is a view of a wafer portion having a pair of flip chip bumps which are to be processed in accordance with an alternate implementation of the invention.

Referring to FIG. 11, an alternate embodiment is described with like numerals from the above described embodiment being utilized where appropriate, with differences being indicated by the suffix "a" or with different numerals or letters. Accordingly, bumps 24a are provided over substrate 22. The bumps can have the same or different heights such as $h_4$, $h_5$.

Figure 12:
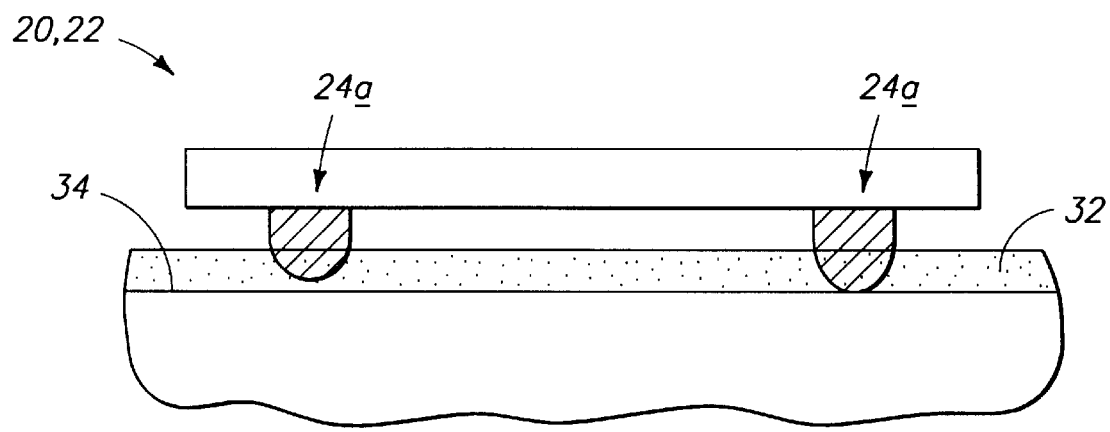
FIG. 12 is a view of the FIG. 11 wafer portion at one processing step.

Referring to FIG. 12, bumps 24a are immersed in flowable material 32. The rightmost bump 24a has a height which is sufficient to bring it into engagement with surface 34. The leftmost bump, however, is not sufficient in height to engage surface 34. Substrate 22 and material 34 are subsequently separated from one another with some conductive material 36a (FIG. 13) remaining over the individual bumps as described above.

Figure 13:
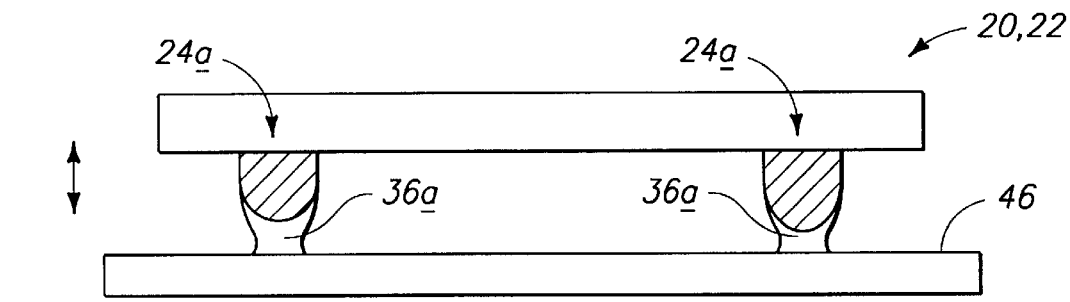
FIG. 13 is a view of the FIG. 11 wafer portion at a different processing step.

Referring to FIG. 13, and while remaining material 36a is in a generally flowable state, such is engaged with and solidified or cured against a generally planar surface 46. Such renders material 36a into a generally non-flowable or solidified state. After material 36a is solidified, substrate 22 and surface 46 are separated from one another.

Figure 14:
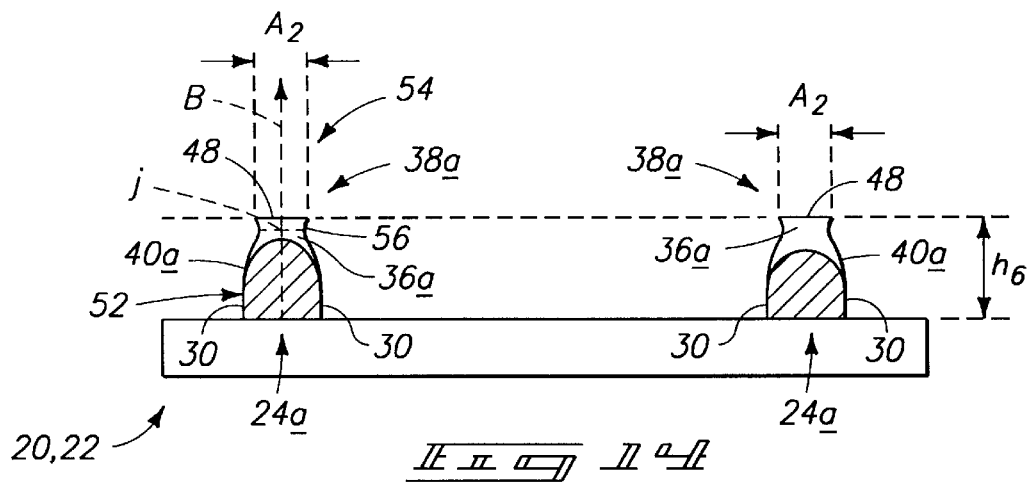
FIG. 14 is a view of the FIG. 11 wafer portion at a different processing step.

Referring to FIG. 14, respective bump assemblies 38a are provided. Each bump assembly 38a includes an outermost surface 40a, a portion of which defines a generally planar uppermost surface 48 away from substrate 22. Uppermost surfaces 48 define respective second surface areas $A_2$. The magnitudes of the first and second surface areas can be different from one another, e.g., second surface areas $A_2$ can be less in magnitude than first surface areas A (FIG. 3). In the illustrated example, the first and second surface areas define planes which are generally parallel with one another.

Processing bumps 24a in accordance with this aspect of the invention provides bump assemblies 38a which are essentially uniform in height relative to the substrate over which each is formed.

Alternately considered and with reference to the leftmost bump assembly 38a, a main body portion 52 is disposed over substrate 22 and extends away therefrom along a central axis B. A top portion 54 is joined with main body portion 52 proximate a joinder region j, indicated by a dashed line intermediate uppermost surface 48 and substrate 22. A side surface 56 is joined with uppermost surface 48 and extends away therefrom and toward central axis B. In the illustrated example, main body portion 52 tapers along central axis B away from substrate 22; and top portion 54 approximates a frustum.

The above-described methodologies provide flip chip bumps having greater heights without meaningfully increasing, if at all, the width dimensions thereof. This allows desirable spacing to be maintained between bonded substrates and reduces the likelihood that the epoxy to which the bump is bonded on another substrate undesirably contacts the substrate from which the bumps project.

In compliance with the stature, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A conductive flip chip bump consisting essentially of:
    a main body portion disposed over a substrate and extending outwardly therefrom along a central axis; and
    a top portion joined with the main body portion proximate a joinder region, the top portion having an outwardly exposed generally planar uppermost surface outwardly of the joinder region and a side surface joined with the uppermost surface and extending away therefrom and toward the central axis.

2. The flip chip bump of claim 1, wherein the main body portion tapers along the central axis away from the substrate.

3. The flip chip bump of claim 1, wherein the top portion approximates a frustum.

4. A flip chip bump assembly comprising:
    a pair of spaced-apart first flip chip bumps disposed over a substrate, individual bumps comprising a conductive mass which extends away from the substrate to define individual respective first flip chip bump heights which are different; and a pair of outwardly exposed flip chip bump extensions each of which being joined with a respective one of the first flip chip bumps and extending away therefrom to define, together with its associated flip chip bump, generally uniform second flip chip bumps heights.

5. The flip chip bump assembly of claim 4, wherein the flip chip bump extensions have generally planar uppermost surfaces.

6. The flip chip bump assembly of claim 4, wherein the first flip chip bumps comprise one or more conductive materials, the flip chip bump extensions comprising a material which is different from all conductive material comprising the first flip chip bumps.

7. The flip chip bump assembly of claim 4, wherein the flip chip bump extensions have generally planar uppermost surfaces and the first flip chip bumps comprise one or more conductive materials, the flip chip bump extensions comprising a material which is different from all conductive material comprising the first flip chip bumps.

8. A conductive flip chip bump consisting essentially of:

a mass of conductive material disposed over a substrate and extending outwardly therefrom along a central axis, the mass comprising an innermost surface joined with a substrate; an outermost generally planar exposed surface; and a pair of side surfaces received between the innermost and the outermost surfaces; the side surfaces including opposing portions proximate the outermost surface which angle inwardly toward the central axis from proximate the outermost surface.

9. The flip chip bump of claim 8 wherein the side surfaces include opposing portions proximate the innermost surface which extend substantially straight perpendicularly from the substrate.

* * * * *

UNITED STATES PATENT AND TRADEMARK OFFICE
CERTIFICATE OF CORRECTION

PATENT NO.   : 6,087.731
DATED        : July 11, 2000
INVENTOR     : Rickie C. Lake It is certified that error appears in the above-identified patent and that said Letters Patent are hereby corrected as shown below:

Column 1, delete the RELATED PATENT DATA section and insert the following:
-- <u>RELATED PATENT DATA</u>

This patent resulted from a divisional application of U.S. Patent Application Serial No. 08/931,814, filed September 16, 1997, entitled "Methods of Forming Flip Chip Bumps and Related Flip Chip Bump Constructions", naming Rickie C. Lake as inventor, and which is now U.S. Patent No. 6,083,773 which issued July 4, 2000, the disclosure of which is incorporated by reference.--

Column 2, line 61, "hi." should be --$h_1$.--

Signed and Sealed this

Seventeenth Day of April, 2001

Attest:

NICHOLAS P. GODICI

*Attesting Officer*   Acting Director of the United States Patent and Trademark Office